(12) United States Patent
Ono et al.

(10) Patent No.: US 10,603,726 B2
(45) Date of Patent: Mar. 31, 2020

(54) SURFACE COATED CUTTING TOOL AND METHOD FOR MANUFACTURING THE SAME

(71) Applicant: SUMITOMO ELECTRIC HARDMETAL CORP., Itami-shi (JP)

(72) Inventors: Satoshi Ono, Sorachi-gun (JP); Shinya Imamura, Sorachi-gun (JP); Takanori Detani, Sorachi-gun (JP); Anongsack Paseuth, Sorachi-gun (JP)

(73) Assignee: Sumitomo Electric Hardmetal Corp., Itami-shi (JP)

( * ) Notice: Subject to any disclaimer, the term of this patent is extended or adjusted under 35 U.S.C. 154(b) by 213 days.

(21) Appl. No.: 15/550,513

(22) PCT Filed: Nov. 30, 2016

(86) PCT No.: PCT/JP2016/085501
§ 371 (c)(1),
(2) Date: Aug. 11, 2017

(87) PCT Pub. No.: WO2017/122448
PCT Pub. Date: Jul. 20, 2017

(65) Prior Publication Data
US 2018/0029144 A1   Feb. 1, 2018

(30) Foreign Application Priority Data
Jan. 13, 2016   (JP) .................. 2016-004572

(51) Int. Cl.
*B23B 27/14* (2006.01)
*B23C 5/16* (2006.01)
(Continued)

(52) U.S. Cl.
CPC ................ *B23C 5/16* (2013.01); *B23B 27/14* (2013.01); *B23B 27/148* (2013.01);
(Continued)

(58) Field of Classification Search
USPC .......... 407/119; 427/255.23, 255.28, 255.36, 427/255.39, 255.391, 255.394; 51/307,
(Continued)

(56) References Cited

U.S. PATENT DOCUMENTS

| | | | |
|---|---|---|---|
| 2009/0067938 A1* | 3/2009 | Omori | B23B 27/141 407/119 |
| 2009/0123779 A1 | 5/2009 | Endler | |
| 2009/0255805 A1* | 10/2009 | Hanyu | B23K 15/08 204/192.34 |
| 2010/0233511 A1* | 9/2010 | Endler | C23C 16/029 428/698 |

(Continued)

FOREIGN PATENT DOCUMENTS

| | | |
|---|---|---|
| CN | 104073776 A | 10/2014 |
| DE | 102007000512 B3 | 1/2009 |

(Continued)

*Primary Examiner* — Archene A Turner
(74) *Attorney, Agent, or Firm* — Baker Botts L.L.P.; Michael A. Sartori

(57) ABSTRACT

A surface coated cutting tool having surfaces including a rake face and a flank face and a cutting edge defined by a boundary portion between the rake face and the flank face includes a substrate and a coating which covers the surfaces of the substrate, the coating having a TiAlN layer having an NaCl type crystal structure, and relation of $0.65<XR\leq 0.9$, $0.65<XF\leq 0.9$, $0.4\leq XE\leq 0.7$, $XR-XE\geq 0.2$, and $XF-XE\geq 0.2$ being satisfied, with a composition of the TiAlN layer in a cutting edge region located in the cutting edge being expressed as $Ti_{1-XE}Al_{XE}N$, a composition thereof in a rake face region located in the rake face being expressed as $Ti_{1-XR}Al_{XR}N$, and a composition thereof in a flank face region located in the flank face being expressed as $Ti_{1-XF}Al_{XF}N$.

6 Claims, 9 Drawing Sheets

(51) Int. Cl.
*C23C 16/34* (2006.01)
*C23C 16/455* (2006.01)
*C23C 30/00* (2006.01)
*C23C 16/02* (2006.01)
*C23C 28/04* (2006.01)

(52) U.S. Cl.
CPC .......... *C23C 16/0272* (2013.01); *C23C 16/34* (2013.01); *C23C 16/455* (2013.01); *C23C 16/45587* (2013.01); *C23C 16/45591* (2013.01); *C23C 28/044* (2013.01); *C23C 30/005* (2013.01); *B23B 2200/242* (2013.01); *B23B 2200/245* (2013.01); *B23B 2200/247* (2013.01); *B23B 2224/24* (2013.01); *B23B 2228/04* (2013.01); *B23B 2228/105* (2013.01)

(58) Field of Classification Search
USPC .......................... 51/309; 428/336, 697, 698
See application file for complete search history.

(56) References Cited

U.S. PATENT DOCUMENTS

| | | | | |
|---|---|---|---|---|
| 2013/0022420 A1* | 1/2013 | Waki | .................. | C23C 14/0664 407/115 |
| 2013/0287507 A1* | 10/2013 | Lind | .................. | C23C 14/0021 407/119 |
| 2017/0165758 A1 | 6/2017 | Tatsuoka et al. | | |

FOREIGN PATENT DOCUMENTS

| | | | |
|---|---|---|---|
| EP | 2940181 A1 | | 11/2015 |
| JP | 05-337705 | * | 12/1993 |
| JP | H08-267306 A | | 10/1996 |
| JP | 2001-341008 | * | 12/2001 |
| JP | 2007-169691 A | | 7/2007 |
| JP | 2008-264975 A | | 11/2008 |
| JP | 2008-545063 A | | 12/2008 |
| JP | 2009-066673 | * | 4/2009 |
| JP | 2015-110256 A | | 6/2015 |
| WO | 2012/126030 A1 | | 9/2012 |
| WO | 2015/163391 A1 | | 10/2015 |

* cited by examiner

SURFACE COATED CUTTING TOOL AND METHOD FOR MANUFACTURING THE SAME

TECHNICAL FIELD

The present invention relates to a surface coated cutting tool and a method for manufacturing the same. The present application claims priority to Japanese Patent Application No. 2016-004572 filed on Jan. 13, 2016, the entire contents of which are hereby incorporated by reference.

BACKGROUND ART

A surface coated cutting tool in which a hard coating is provided on surfaces of a substrate is available as a cutting tool used in cutting of steel or cast iron. A coating composed of TiAlN which is a compound of titanium (Ti), aluminum (Al), and nitrogen (N) and has an NaCl type crystal structure (hereinafter called a "TiAlN coating") has been known as one of such hard coatings. The TiAlN coating has conventionally been fabricated with physical vapor deposition (PVD) and improvement in composition or the like has been attempted in order to exhibit desired physical properties.

For example, PTD 1 discloses a surface coated cutting tool in which a composition of a TiAlN coating fabricated with PVD is varied for each portion in a tool. It has been known that a hardness of the TiAlN coating can be enhanced by increasing a content of Al therein, and various studies have been conducted to realize such enhancement. When a ratio of blended Al exceeds 0.65 in the TiAlN coating fabricated with PVD, however, wurtzite type AlN is precipitated and consequently a sufficient hardness as expected cannot actually be exhibited.

Recently, by fabricating the TiAlN coating with chemical vapor deposition (CVD), a ratio of blended Al can exceed 0.65 while the NaCl type crystal structure is maintained. For example, PTD 2 discloses manufacturing with CVD of a TiAlN coating in which a ratio of Al exceeds 0.75 and is not higher than 0.93.

With successful fabrication with CVD of a TiAlN coating in which a ratio of blended Al is enhanced, however, a new problem of "lowering in fracture resistance due to an excessively high content of Al" has arisen. This problem has arisen because too high a hardness of the TiAlN coating leads to low toughness of the TiAlN coating and a resulting fracture of the TiAlN coating.

In order to address the problem above, PTDs 3 and 4 disclose suppression of excessive increase in hardness and hence suppression of lowering in fracture resistance by intentionally precipitating wurtzite type AlN in the TiAlN coating.

CITATION LIST

Patent Document

PTD 1: Japanese Patent Laying-Open No. 8-267306
PTD 2: Japanese National Publication No. 2008-545063
PTD 3: International Publication No. 2012/126030
PTD 4: German Patent No. 102007000512

SUMMARY OF INVENTION

A surface coated cutting tool according to one manner of the present disclosure is a surface coated cutting tool having surfaces including a rake face and a flank face and a cutting edge defined by a boundary portion between the rake face and the flank face, and the surface coated cutting tool includes a substrate and a coating which covers the surfaces of the substrate, the coating having a TiAlN layer having an NaCl type crystal structure, and relation of $0.65 < XR \leq 0.9$, $0.65 < XF \leq 0.9$, $0.4 \leq XE \leq 0.7$, $XR - XE \geq 0.2$, and $XF - XE \geq 0.2$ being satisfied, with a composition of the TiAlN layer in a cutting edge region located in the cutting edge being expressed as $Ti_{1-XE}Al_{XE}N$, a composition thereof in a rake face region located in the rake face being expressed as $Ti_{1-XR}Al_{XR}N$, and a composition thereof in a flank face region located in the flank face being expressed as $Ti_{1-XF}Al_{XF}N$.

A method for manufacturing a surface coated cutting tool according to one manner of the present disclosure is a method for manufacturing the surface coated cutting tool described above, and the method includes forming the TiAlN layer with CVD on the substrate arranged in a reaction furnace, the forming the TiAlN layer including a first step of supplying a first source material gas containing Ti and Al and a second source material gas containing ammonia into the reaction furnace where the substrate is arranged, and in the first step, an amount of Al which reaches the surface of the substrate corresponding to the cutting edge region being smaller than each of an amount of Al which reaches the surface of the substrate corresponding to the rake face region and an amount of Al which reaches the surface of the substrate corresponding to the flank face region.

DESCRIPTION OF EMBODIMENTS

Figure 1:
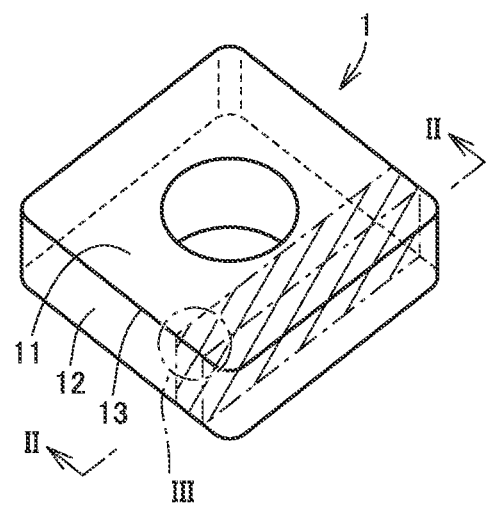
FIG. 1 is a perspective view showing one example of a surface coated cutting tool according to one embodiment of the present disclosure.

[Problem to be Solved by Present Disclosure]

In precipitating AlN in a TiAlN coating with CVD, it is difficult to control a ratio, a position of precipitation or the like thereof. Therefore, it is substantially difficult to industrially produce a surface coated cutting tool having a TiAlN coating as disclosed in PTDs 3 and 4. For such reasons, development of a surface coated cutting tool which has a high hardness derived from a TiAlN coating having an NaCl type crystal structure and can exhibit high fracture resistance is demanded.

An object of the present disclosure is to provide a surface coated cutting tool excellent in characteristics of both of a hardness and fracture resistance.

[Effects of Present Disclosure]

According to the above, a surface coated cutting tool excellent in characteristics of both of a hardness and fracture resistance can be provided.

[Description of Embodiments of Present Invention]

Embodiments of the present invention will initially be listed and described. In crystallographic denotation herein, an individual plane is shown in parentheses. An expression in a form "A to B" herein means the upper limit and the lower limit of the range (that is, not less than A and not more than B). When a unit for A is not given and a unit is given only for B, the unit for A and the unit for B are the same. When an atomic ratio is not particularly limited herein in a chemical formula such as "TiAlN", "TiN", and "TiCN", it does not indicate that an atomic ratio of each element is limited only to "1" but encompasses all conventionally known atomic ratios.

The present inventors have assumed that it is difficult to control precipitation of wurtzite type AlN with a conventional technique in fabricating with CVD a TiAlN coating high in ratio of blended Al and it is difficult to actually provide a coating excellent in hardness and fracture resistance. Then, the present inventors have noted a technique for varying a composition of a TiAlN coating for each position in a tool as a technique significantly different from the conventional technique.

Since CVD is basically a technique for forming a uniform coating, the present inventors faced many difficulties in establishing our technique. As a result of various studies based on the viewpoint above, however, the present inventors have conceived realization of the technique by making a method of supplying each source material gas to each surface of a substrate distinctive. The present inventors have further conducted dedicated studies based on this conception and completed the present invention.

[1] A surface coated cutting tool according to one manner of the present invention is a surface coated cutting tool having surfaces including a rake face and a flank face and a cutting edge defined by a boundary portion between the rake face and the flank face, and the surface coated cutting tool includes a substrate and a coating which covers the surfaces of the substrate, the coating having a TiAlN layer having an NaCl type crystal structure, and relation of $0.65 < XR \leq 0.9$, $0.65 < XF \leq 0.9$, $0.4 \leq XE \leq 0.7$, $XR - XE \geq 0.2$, and $XF - XE \geq 0.2$ being satisfied, with a composition of the TiAlN layer in a cutting edge region located in the cutting edge being expressed as $Ti_{1-XE}Al_{XE}N$, a composition thereof in a rake face region located in the rake face being expressed as $Ti_{1-XR}Al_{XR}N$, and a composition thereof in a flank face region located in the flank face being expressed as $Ti_{1-XF}Al_{XF}N$.

The surface coated cutting tool can exhibit a remarkably high hardness in the flank face and the rake face and it is excellent in balance between toughness and a hardness in the cutting edge to which heaviest load is applied. Therefore, the tool as a whole can exhibit high fracture resistance while it maintains a high hardness. Therefore, the surface coated cutting tool is excellent in hardness and fracture resistance.

[2] In the surface coated cutting tool, the TiAlN layer preferably has an orientation index TC (111) of a (111) plane satisfying relation of $1 < TC (111) \leq 4$. In this case, the surface coated cutting tool is higher in wear resistance.

[3] In the surface coated cutting tool, the TiAlN layer has a thickness preferably from 1 to 10 μm. In this case, the characteristics above are better.

[4] In the surface coated cutting tool, the coating has a thickness preferably from 3 to 15 μm. In this case, suitability as a cutting tool is excellent.

A method for manufacturing a surface coated cutting tool according to one manner of the present invention is a method for manufacturing the surface coated cutting tool described above, and the method includes forming the TiAlN layer with CVD on the substrate arranged in a reaction furnace, the forming the TiAlN layer including a first step of supplying a first source material gas containing Ti and Al and a second source material gas containing ammonia into the reaction furnace where the substrate is arranged, and in the first step, an amount of Al which reaches the surface of the substrate corresponding to the cutting edge region being smaller than each of an amount of Al which reaches the surface of the substrate corresponding to the rake face region and an amount of Al which reaches the surface of the substrate corresponding to the flank face region.

According to the manufacturing method, such control that a composition of a TiAlN layer in a portion corresponding to each region (a cutting edge region, a rake face region, and a flank face region) is varied can be achieved. Therefore, the surface coated cutting tool described above can be manufactured.

[Details of Embodiments of Present Invention]

One embodiment of the present invention (hereinafter denoted as the "present embodiment") will be described hereinafter, however, the present embodiment is not limited thereto.

<Surface Coated Cutting Tool>

As shown in FIG. 1, a surface coated cutting tool 1 in the present embodiment (hereinafter simply also denoted as a "tool 1") has surfaces including an upper surface, a lower surface, and four side surfaces, and it is in a shape of a prism slightly small in thickness in a vertical direction as a whole. Tool 1 is provided with a through hole which passes through the upper and lower surfaces and adjacent side surfaces are connected to each other with an arc surface in a boundary portion of four side surfaces of tool 1.

In tool 1 in the present embodiment, the upper surface and the lower surface are defined as rake faces 11 and four side surfaces (and the arc surfaces connecting these side surfaces) are defined as flank faces 12. A boundary portion between rake face 11 and flank face 12 functions as a cutting edge 13. In other words, tool 1 in the present embodiment has surfaces (the upper surface, the lower surface, the four side surfaces, the arc surfaces connecting these side surfaces, and an inner circumferential surface of the through hole) including rake face 11 and flank face 12 and cutting edge 13 defined by the boundary portion between rake face 11 and flank face 12.

The boundary portion between rake face 11 and flank face 12 means "combination of a ridgeline E defining a boundary between rake face 11 and flank face 12 and a portion in the vicinity of ridgeline E in rake face 11 and flank face 12." The "portion in the vicinity of ridgeline E in rake face 11 and flank face 12" is determined by a shape of cutting edge 13 of tool 1. A tool in a shape of a sharp edge, a honed tool which has been subjected to honing, and a tool in a shape of a negative land subjected to negative land working, all of which represent tool 1, will be described below.

Figure 2:
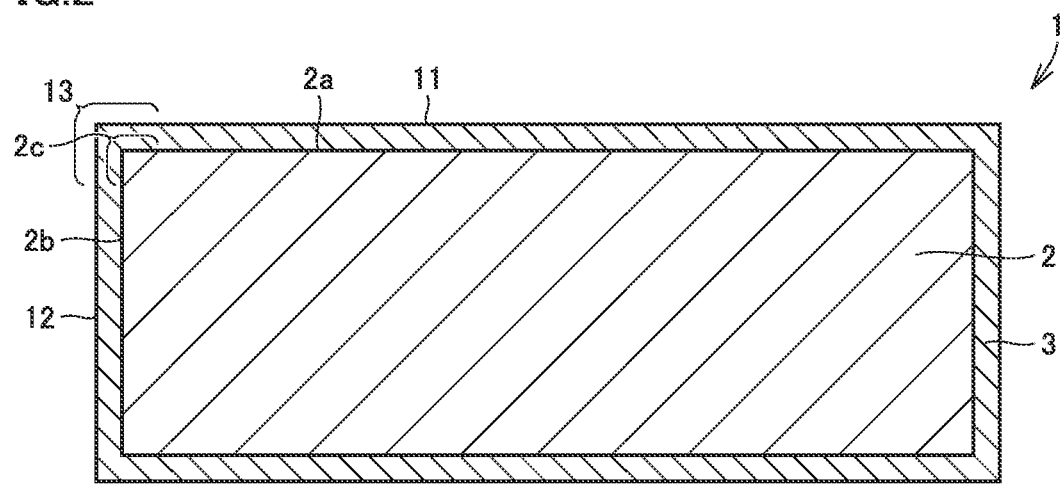
FIG. 2 is a cross-sectional view of the surface coated cutting tool in FIG. 1 along the line II-II in FIG. 1.
Figure 3:
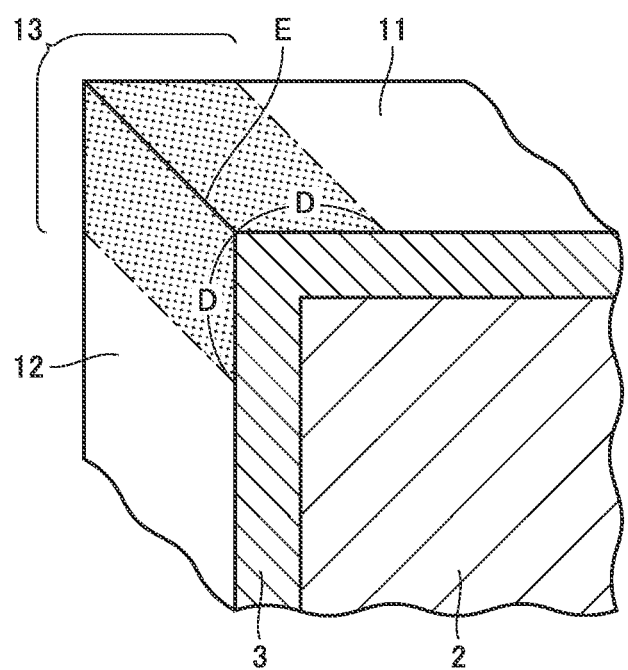
FIG. 3 is a diagram showing a hatched portion in FIG. 1 in a perspective cross-section showing a III region.

FIGS. 2 and 3 show tool 1 in a shape of a sharp edge. In tool 1 in such a shape of a sharp edge, the "portion in the vicinity of ridgeline E in rake face 11 and flank face 12" is defined as a region which extends from ridgeline E by a distance (a linear distance) D not greater than 50 μm (a dotted region in FIG. 3). Therefore, cutting edge 13 in tool 1 in a shape of a sharp edge is defined as a portion corresponding to the dotted region in FIG. 3.

Figure 4:
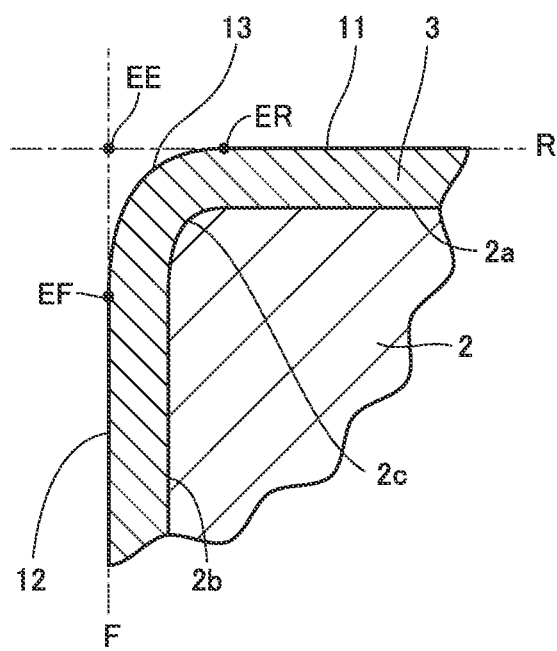
FIG. 4 is a partial view of a honed cutting edge in the cross-sectional view shown in FIG. 2.
Figure 5:
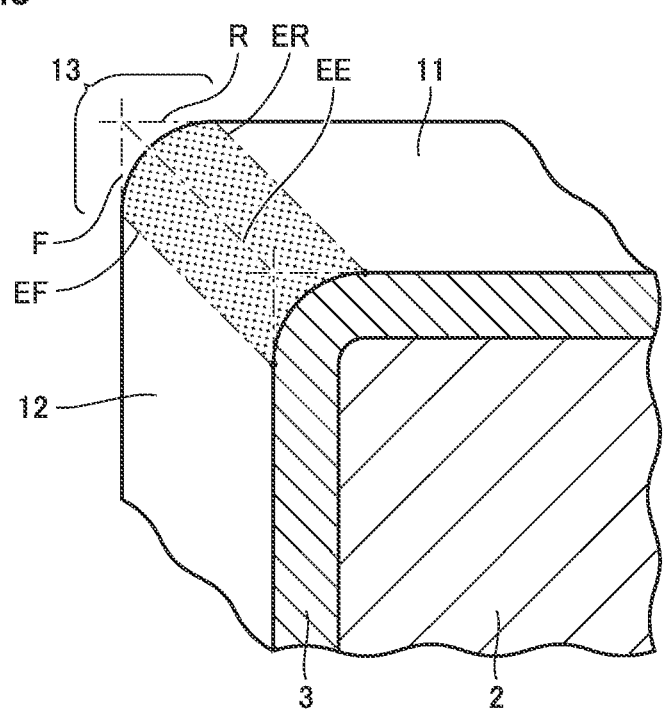
FIG. 5 is a perspective cross-sectional view of a honed cutting edge in the perspective cross-section shown in FIG. 3.

FIGS. 4 and 5 show honed tool 1 which has been subjected to honing. FIGS. 4 and 5 show a virtual plane R including rake face 11, a virtual plane F including flank face 12, a virtual ridgeline EE defined by intersection between virtual plane R and virtual plane F, a virtual boundary line ER defining a boundary of separation between rake face 11 and virtual plane R, and a virtual boundary line EF defining a boundary of separation between flank face 12 and virtual plane F in addition to each portion of tool 1. In honed tool 1, "ridgeline E" above is read as "virtual ridgeline EE."

In such honed tool 1, the "portion in the vicinity of virtual ridgeline EE in rake face 11 and flank face 12" is defined as a region lying between virtual boundary line ER and virtual boundary line EF (a dotted region in FIG. 5). Therefore, cutting edge 13 in honed tool 1 is defined as a portion corresponding to the dotted region in FIG. 5.

Figure 6:
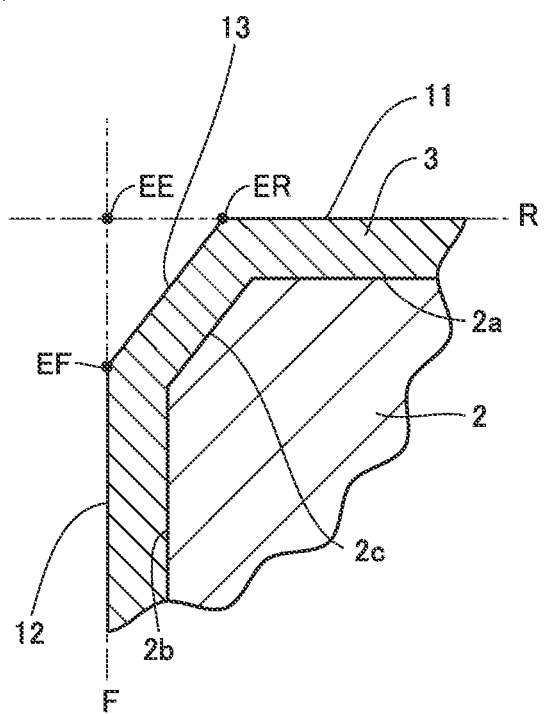
FIG. 6 is a partial view of a cutting edge subjected to negative land working in the cross-sectional view shown in FIG. 2.
Figure 7:
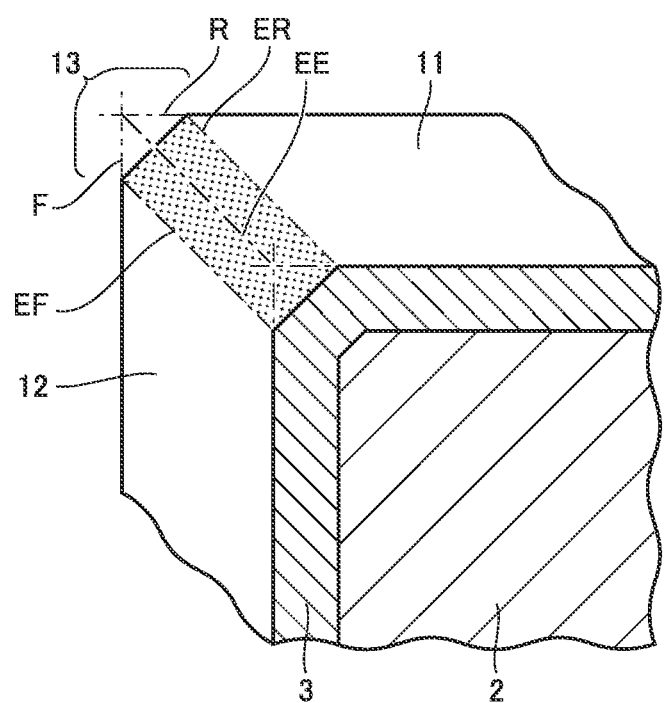
FIG. 7 is a perspective cross-sectional view of a cutting edge subjected to negative land working in the perspective cross-section shown in FIG. 3.

FIGS. 6 and 7 show tool 1 in a shape of a negative land which has been subjected to negative land working. FIGS. 6 and 7 also show virtual plane R including rake face 11, virtual plane F including flank face 12, virtual ridgeline EE defined by intersection between virtual plane R and virtual plane F, virtual boundary line ER defining a boundary of separation between rake face 11 and virtual plane R, and virtual boundary line EF defining a boundary of separation between flank face 12 and virtual plane F in addition to each portion of tool 1. In tool 1 in a shape of a negative land as well, "ridgeline E" above is read as "virtual ridgeline EE."

In such tool 1 in a shape of a negative land, the "portion in the vicinity of virtual ridgeline EE in rake face 11 and flank face 12" is defined as a region lying between virtual boundary line ER and virtual boundary line EF (a dotted region in FIG. 7). Therefore, cutting edge 13 in tool 1 in a shape of a negative land is defined as a portion corresponding to the dotted region in FIG. 7.

Figure 8:
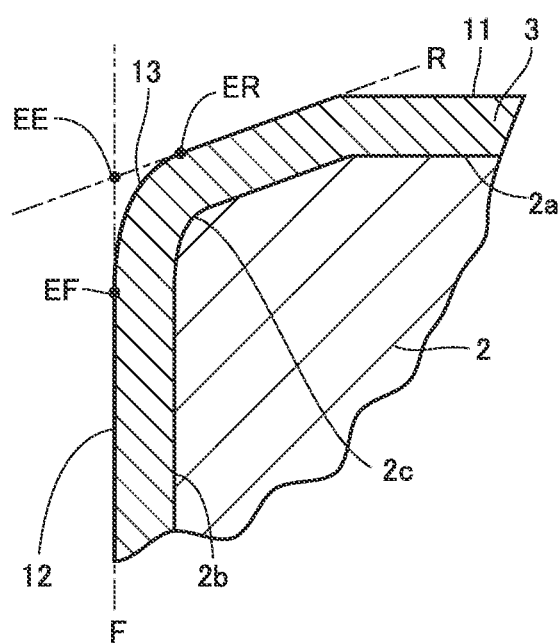
FIG. 8 is a partial view of a cutting edge subjected to honing and negative land working in the cross-sectional view shown in FIG. 2.
Figure 9:
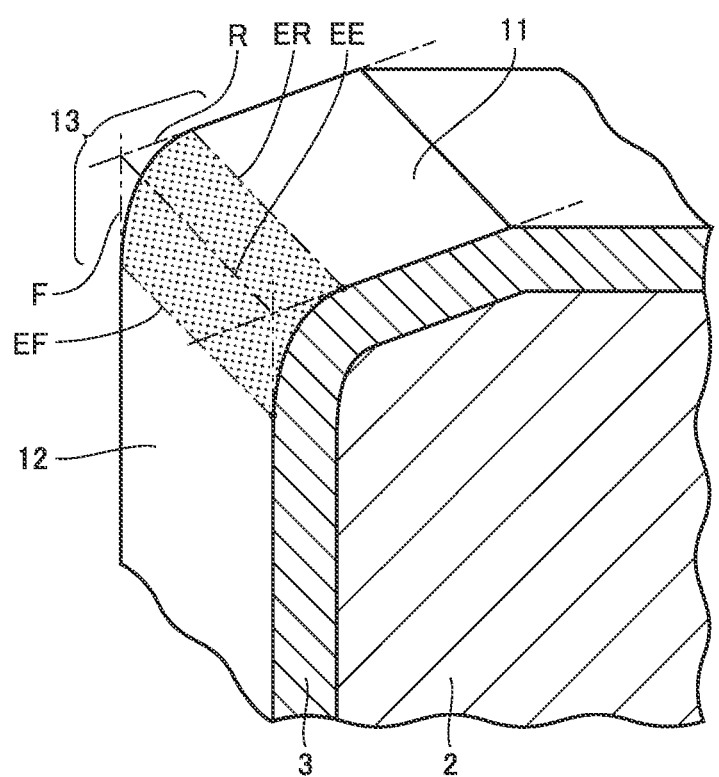
FIG. 9 is a perspective cross-sectional view of a cutting edge subjected to honing and negative land working in the perspective cross-section shown in FIG. 3.

FIGS. 8 and 9 show tool 1 in a shape resulting from combination of honing and negative land working. FIGS. 8 and 9 also show virtual plane R including rake face 11, virtual plane F including flank face 12, virtual ridgeline EE defined by intersection between virtual plane R and virtual plane F, virtual boundary line ER defining a boundary of separation between rake face 11 and virtual plane R, and virtual boundary line EF defining a boundary of separation between flank face 12 and virtual plane F in addition to each portion of tool 1. In tool 1 in a shape of a negative land as well, "ridgeline E" above is read as "virtual ridgeline EE."

Virtual plane R is defined as a surface in rake face 11 including a plane close to cutting edge 13.

In tool 1 in such a shape, the "portion in the vicinity of virtual ridgeline EE in rake face 11 and flank face 12" is defined as a region lying between virtual boundary line ER and virtual boundary line EF (a dotted region in FIG. 9). Therefore, cutting edge 13 in tool 1 is defined as a portion corresponding to the dotted region in FIG. 9.

Referring back to FIG. 1, though FIG. 1 shows tool 1 as a throwaway tip for turning, tool 1 is not limited thereto and examples thereof can include a drill, an end mill, a throwaway tip for a drill, a throwaway tip for an end mill, a throwaway tip for milling, a metal saw, a gear cutting tool, a reamer, and a tap.

When tool 1 is implemented as a throwaway tip, tool 1 may or may not have a chip breaker, and cutting edge 13 may be in any of a shape of a sharp edge (a ridge at which a rake face and a flank face intersect with each other) (see FIGS. 1 to 3), a honed shape (a sharp edge provided with R) (see FIGS. 4 and 5), a shape of a negative land (beveled) (see FIGS. 6 and 7), and a honed shape and a shape of a negative land as combined (see FIGS. 8 and 9).

As shown in FIG. 2, tool 1 has a substrate 2 and a coating 3 covering surfaces of substrate 2. Though coating 3 preferably covers the entire surface of substrate 2 in tool 1, a part of substrate 2 not being covered with coating 3 or a partially different construction of coating 3 does not depart from the scope of the present embodiment.

<Substrate>

As shown in FIGS. 2 and 3, substrate 2 in the present embodiment has a rake face 2a and a flank face 2b. A boundary portion between rake face 2a and flank face 2b is defined as a cutting edge 2c. The "boundary portion between rake face 2a and flank face 2b" means "combination of a ridgeline defining a boundary between rake face 2a and flank face 2b and a portion in the vicinity of the ridgeline in rake face 2a and flank face 2b" similarly to the "boundary portion between rake face 11 and flank face 12" described above. The "portion in the vicinity of the ridgeline in rake face 2a and flank face 2b" is defined as described above depending on whether cutting edge 13 of tool 1 is in a shape of a sharp edge, in a honed shape, or in a shape of a negative land.

For substrate 2, any conventionally known substrate of such a kind can be employed. For example, such a substrate is preferably composed of any of cemented carbide (for example, WC-based cemented carbide, which contains not only WC but also Co, or to which a carbonitride of Ti, Ta, or Nb may be added), cermet (mainly composed of TiC, TiN, or TiCN), high-speed steel, ceramics (titanium carbide, silicon carbide, silicon nitride, aluminum nitride, or aluminum oxide), a cubic boron nitride sintered material, or a diamond sintered material. Among these various substrates, in particular, WC-based cemented carbide or cermet (in particular, TiCN-based cermet) is preferably selected. This is because such substrates are particularly excellent in balance between hardness and strength at a high temperature and have characteristics excellent as a substrate for the surface coated cutting tool.

<Coating>

Coating 3 according to the present embodiment may include other layers so long as it includes a TiAlN layer. Examples of other layers can include a TiN layer, a TiCN layer, a TiBNO layer, a TiCNO layer, an $Al_2O_3$ layer, a $TiB_2$ layer, a TiAlCN layer, a TiAlON layer, and a TiAlONC layer. An order of layering is not particularly limited either.

Such coating 3 in the present embodiment has a function to improve various characteristics such as a hardness and fracture resistance by covering substrate 2.

Coating 3 has a thickness preferably from 3 to 15 μm. When the thickness is smaller than 3 μm, lifetime of the tool may be insufficient. When the thickness exceeds 15 μm, peel-off or destruction of coating 3 may highly frequently occur when a large stress is applied between coating 3 and substrate 2 during intermittent working. The thickness is more preferably from 5 to 15 μm and further preferably from 7 to 15 μm.

<TiAlN Layer>

Coating 3 in the present embodiment includes a TiAlN layer. Coating 3 can include one TiAlN layer or two or more TiAlN layers.

One of features of the TiAlN layer in the present embodiment resides in having an NaCl type crystal structure. "Having an NaCl type crystal structure" means that in measurement of X-ray diffraction spectra of the TiAlN layer, a peak derived from the NaCl type crystal structure is observed but a peak derived from a crystal structure other than the NaCl type crystal structure (for example, a wurtzite type crystal structure) is not observed (that is, is equal to or less than a detection limit). Such X-ray diffraction spectra are measured as below.

Initially, any one flat portion of flank face 12 of tool 1 is cut and fixed to a holder to thereby prepare a sample, and a surface to be measured is smoothened by polishing the sample as necessary. When another layer is formed on the TiAlN layer, that layer is removed by polishing or the like and then the surface of the TiAlN layer is smoothened. Then, X-ray diffraction spectra are obtained by subjecting the TiAlN layer to X-ray diffraction with an X-ray diffractometer (XRD).

X-ray diffraction described above can be conducted under conditions below, for example, with an X-ray diffractometer (SmartLab™ manufactured by Rigaku Corporation).

Diffraction method: θ-2θ method
X-ray source: Cu-Kα rays (1.541862 Å)
Detector: D/Tex Ultra 250
Tube voltage: 45 kV
Tube current: 200 mA
Scanning speed: 20°/minute
Scanning range: 15 to 85°
Slit: 2.0 mm Another feature of the TiAlN layer in the present embodiment resides in satisfying (1) to (5) below:

$$0.65 < XR \leq 0.9; \quad (1)$$

$$0.65 < XF \leq 0.9; \quad (2)$$

$$0.4 \leq XE \leq 0.7; \quad (3)$$

$$XR - XE \geq 0.2; \quad (4)$$

and $$XF - XE \geq 0.2, \quad (5)$$

with a composition of the TiAlN layer in a cutting edge region located in cutting edge 13 being expressed as $Ti_{1-XE}Al_{XE}N$, a composition thereof in a rake face region located in rake face 11 being expressed as $Ti_{1-XR}Al_{XR}N$, and a composition thereof in a flank face region located in flank face 12 being expressed as $Ti_{1-XF}Al_{XF}N$.

XR, XF, and XE can each be found by measuring a composition of the TiAlN layer in each region (the cutting edge region, the rake face region, and the flank face region) with a scanning electron microscope with an energy dispersive X-ray spectroscope (SEM-EDS).

A method of calculating XE will be described. Initially, a measurement sample including a cross-section of the TiAlN layer in the cutting edge region is prepared. The measurement sample is obtained, for example, by cutting tool 1 along a direction of thickness of coating 3 (so as to obtain a cross-section substantially perpendicular to the TiAlN layer). The cross-section of the TiAlN layer in the cutting edge region included in the cut surface is smoothened as necessary by polishing the exposed cut surface.

In preparing a cross-section for a measurement sample, a cross-section in a central portion in the cutting edge region rather than a vicinity of a boundary between the cutting edge region and the rake face region in the cutting edge region is preferably employed. This is because characteristics in the central portion in the cutting edge region affect characteristics as cutting edge 13 of tool 1 more greatly than characteristics in the vicinity of the boundary in the cutting edge region.

Then, the prepared measurement sample is observed with the SEM-EDS to thereby analyze a composition ratio of Al and Ti in the TiAlN layer and calculate a ratio of Al in the TiAlN layer. A ratio of Al is calculated with three or more measurement points being set in one tool 1 and an average value of these values is defined as XE.

Similarly for XR, a measurement sample including a cross-section of the TiAlN layer in the rake face region is prepared and a composition ratio of Al and Ti in the TiAlN layer is analyzed with the SEM-EDS. In calculation of XR as well, a ratio of Al is calculated with three or more measurement points being set in one tool 1 and an average value of these values is defined as XR.

In preparing a cross-section for a measurement sample, a cross-section of a region in the rake face region distant by 50 to 100 μm from the boundary between the cutting edge region and the rake face region is preferably employed. The "boundary between the cutting edge region and the rake face region" corresponds to a boundary between the dotted region and the region which is not dotted in rake face 11 in FIGS. 3, 5, 7, and 9.

Similarly for XF, a measurement sample including a cross-section of the TiAlN layer in the flank face region is prepared and a composition ratio of Al and Ti in the TiAlN layer is analyzed with the SEM-EDS. In calculation of XF as well, a ratio of Al is calculated with three or more measurement points being set in one tool 1 and an average value of these values is defined as XF.

In preparing a cross-section for a measurement sample, a cross-section of a region in the flank face region distant by 50 to 200 μm from the boundary between the cutting edge region and the flank face region is preferably employed. The "boundary between the cutting edge region and the flank face region" corresponds to a boundary between the dotted region and the region which is not dotted in flank face 12 in FIGS. 3, 5, 7, and 9.

Analysis with the SEM-EDS described above can be conducted under conditions below, for example, with a scanning electron microscope (S-3400N manufactured by Hitachi High-Technologies Corporation).

Acceleration voltage: 15 kV
Process time: 5
Spectrum range: 0 to 20 keV
The number of channels: 1K
The number of frames: 150
Angle of extraction of X-rays: 30°

In calculating XE, a position of a cross-section of the TiAlN layer employed as the measurement sample is preferably determined in view of a state of actual use of tool 1. Specifically, when tool 1 is used for cutting a work material at cutting edge 13 in a cutting edge portion (a portion at a vertical angle which traces an arc), a cross-section of the TiAlN layer located in the cutting edge region in the cutting edge portion is preferably employed as the measurement sample. When tool 1 is used for cutting a work material at cutting edge 13 in a straight portion (a portion which traces a straight line), a cross-section of the TiAlN layer located in the cutting edge region in the straight portion is preferably employed as the measurement sample. Such selection is made because the position is directly associated with actual characteristics of the tool when tool 1 is used as a cutting tool.

In calculating XR as well, a position of a cross-section of the TiAlN layer employed as the measurement sample is preferably determined in view of a state of actual use of tool 1. Specifically, when tool 1 is used for cutting a work material at cutting edge 13 in a cutting edge portion, the cross-section of the TiAlN layer located in the rake face region in the vicinity of the cutting edge region in the cutting edge portion is preferably employed as the measurement sample, because characteristics of rake face 11 in the vicinity of the cutting edge portion are directly associated with actual characteristics of the tool when tool 1 is employed as the cutting tool. For similar reasons, when tool 1 is used for cutting a work material at cutting edge 13 in a straight portion, a cross-section of the TiAlN layer located in the rake face region in the vicinity of the cutting edge region in the straight portion is preferably employed as the measurement sample. This is also applicable to calculation of XF.

The TiAlN layer having the NaCl type crystal structure and satisfying (1) to (5) above can be high in hardness and fracture resistance and hence excellent in hardness and fracture resistance. Therefore, tool 1 with such a TiAlN layer can be excellent in hardness and fracture resistance. The present inventors consider the reasons therefor as follows.

The TiAlN layer in the present embodiment has a region where a ratio of Al exceeds 0.65 as defined in (1) to (3) above. In spite of that fact, the TiAlN layer maintains the NaCl type crystal structure. Such a TiAlN layer could not be fabricated with conventional PVD and thus it can have a high hardness. Furthermore, the TiAlN layer is lower in ratio of Al in cutting edge 13 (the cutting edge region) than in rake face 11 (the rake face region) and flank face 12 (the flank face region) as further defined in (4) and (5) above. According to such a construction, the TiAlN layer can exhibit a remarkably high hardness in rake face 11 and flank face 12 and can be excellent in balance between toughness and hardness in cutting edge 13 to which heaviest load is applied (that is, where a fracture is likely). Therefore, tool 1 as a whole can exhibit a high hardness and high fracture resistance suitable for actual use.

The TiAlN layer in the present embodiment detailed above preferably satisfies relation in (3) of $0.4 < XE < 0.55$. In this case, the effect is higher. Though the upper limit value for (4) and (5) above is not particularly limited, it is preferably not greater than 0.4 and more preferably not greater than 0.38 from a point of view of balance between a hardness and fracture resistance.

The TiAlN layer in the present embodiment has an orientation index TC (111) of a (111) plane satisfying relation preferably of $1.0 < TC(111) \leq 4.0$ and more preferably of $2.0 < TC(111) \leq 4.0$. In this case, wear resistance is higher.

The "orientation index" is generally denoted with an orientation index TC (hkl) and shown in an expression below.

$$TC(hkl) = \frac{I(hkl)}{I_o(hkl)} \left\{ \frac{1}{n} \sum_1^n \frac{I(hkl)}{I_o(hkl)} \right\}^{-1} \quad (1)$$

In the expression (1), I (hkl) represents X-ray diffraction intensity of an (hkl) reflection surface and $I_o$ (hkl) represents standard intensity defined in ICDD database 00-046-1200. n in the expression (1) represents the number of reflections used for calculation and it is set to 5 in the present embodiment. (hkl) planes used for reflection are (111), (200), (220), (311), and (222). Therefore, TC (111) in the TiAlN layer in the present embodiment can be expressed in an expression (2) below.

$$TC(111) = \frac{I(111)}{I_o(111)} \left\{ \frac{1}{5} \sum_1^5 \frac{I(hkl)}{I_o(hkl)} \right\}^{-1} \quad (2)$$

In the present embodiment, orientation index TC (111) of the (111) plane of the TiAlN layer shown in the expression (2) can be found through analysis using XRD.

Measurement can be conducted under conditions below, for example, with an X-ray diffractometer (SmartLab™ manufactured by Rigaku Corporation).

Diffraction method: θ-2θ method
X-ray source: Cu-Kα rays (1.541862 Å)
Detector: D/Tex Ultra 250
Tube voltage: 45 kV
Tube current: 200 mA
Scanning speed: 20°/minute
Scanning range: 15 to 85°
Slit: 2.0 mm The TiAlN layer in the present embodiment has a thickness preferably from 1 to 10 μm. When the thickness is smaller than 1 μm, a hardness and fracture resistance may not sufficiently be exhibited. When the thickness exceeds 10 μm, the TiAlN layer may peel off. The thickness is more preferably from 2 to 10 μm and further preferably from 5 to 7 μm.

The TiAlN layer in the present embodiment may contain an impurity so long as the effect above is obtained. Examples of the impurity include chlorine (Cl), oxygen (O), carbon (C), argon (Ar), and hydrogen (H). Among these, Cl is a specific element which may be contained in the TiAlN layer fabricated with CVD but cannot be introduced in the TiAlN layer fabricated with PVD. A concentration of Cl in the TiAlN layer is from 0.05 to 0.20 atomic %.

<Other Layers>

Coating 3 in the present embodiment may include other layers as described above. Though examples of other layers are listed above, for example, a TiCN layer or a TiN layer is suitable for an underlying layer in contact with a surface of substrate 2. In this case, adhesiveness between substrate 2 and coating 3 is excellent. A TiCNO layer or an $Al_2O_3$ layer is suitable as a surface layer located at an outermost surface of coating 3. In this case, resistance to oxidation of coating 3 is higher.

<Manufacturing Method>

A manufacturing method of a surface coated cutting tool in the present embodiment includes forming with CVD a TiAlN layer on a substrate arranged in a reaction furnace.

The step of forming a TiAlN layer includes a first step of supplying a first source material gas containing Ti and Al and a second source material gas containing ammonia into the reaction furnace where the substrate is arranged. In the first step, an amount of Al which reaches the surface of the substrate corresponding to the cutting edge region is smaller than each of an amount of Al which reaches the surface of the substrate corresponding to the rake face region and an amount of Al which reaches the surface of the substrate corresponding to the flank face region.

The "surface of the substrate corresponding to the cutting edge region" means a surface of the substrate where a TiAlN layer corresponding to the cutting edge region is to be arranged. Similarly, the "surface of the substrate corresponding to the rake face region" means a surface of the substrate where a TiAlN layer corresponding to the rake face region is to be arranged and the "surface of the substrate corresponding to the flank face region" means a surface of the substrate where a TiAlN layer corresponding to the flank face region is to be arranged.

The coating of the surface coated cutting tool in the present embodiment can be manufactured with CVD, and when a layer other than the TiAlN layer in the coating is formed, such a layer can be formed under a conventionally known condition. The TiAlN layer can be formed with the specific CVD above.

Figure 10:
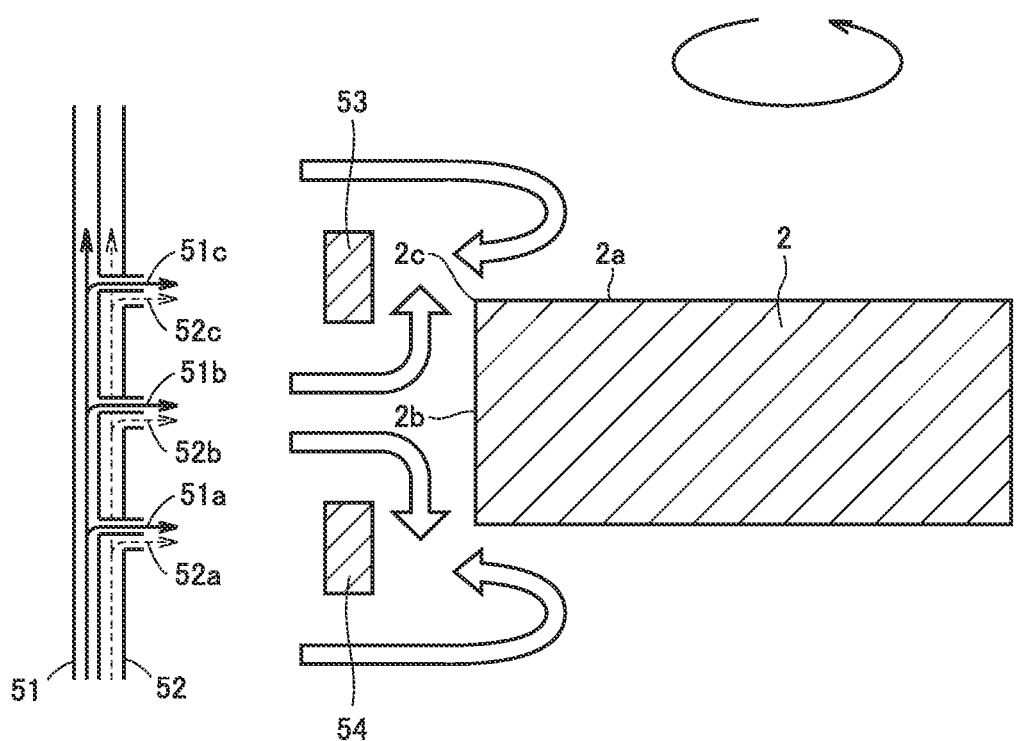
FIG. 10 is a schematic diagram for illustrating arrangement of a substrate in a reaction furnace of a CVD apparatus.

A CVD apparatus with a reaction furnace shown in FIG. 10 represents one example of a CVD apparatus with which the specific CVD can be performed. A first pipe 51 and a second pipe 52 are arranged in the reaction furnace shown in FIG. 10. First pipe 51 and second pipe 52 have through holes 51a to 51c and through holes 52a to 52c, respectively. First pipe 51 and the reaction furnace communicate with each other through through holes 51a to 51c, and second pipe 52 and the reaction furnace communicate with each other through through holes 52a to 52c.

Though FIG. 10 shows through holes 51a to 51c and through holes 52a to 52c as being slightly different in height (in the vertical direction in the figure) from each other, it is merely for ease of understanding and the holes are preferably the same in height. Through hole 51a and through hole 52a, through hole 51b and through hole 52b, and through hole 51c and through hole 52c are preferably arranged at the same height for each set.

In the step of forming a TiAlN layer, substrate 2 is arranged in the reaction furnace. Shield plates 53 and 54 are arranged between the surface of cutting edge 2c of substrate 2 (the surface of the substrate corresponding to the cutting edge region) and the through hole (51a to 51c and 52a to 52c) such that they do not directly face each other. A pressure and a temperature in the reaction furnace can be controlled to 0.5 to 3.0 kPa and 600 to 900° C., respectively. Substrate 2 preferably is rotated as shown with a rotational arrow in the figure.

In the first step, first pipe 51 is supplied with the first source material gas containing Ti and Al and second pipe 52 is supplied with the second source material gas containing ammonia ($NH_3$). Specific examples of the first source material gas include a gas mixture composed of $AlCl_3$, $TiCl_4$, HCl, $N_2$, and Ar. Specific examples of the second source material gas include a gas mixture composed of $NH_3$, $N_2$, and Ar. By feeding the first source material gas and the second source material gas to pipes different from each other, reaction between $AlCl_3$ or $TiCl_4$ and $NH_3$ before injection into the reaction furnace can be suppressed.

Though a ratio of Ti and Al in the first source material gas is not particularly restricted, it has been derived from various experiments that $AlCl_3/TiCl_4$ (a volume ratio) is preferably from 1 to 5 and further preferably from 2 to 4 in forming a TiAlN layer in the present embodiment, for example, by using $AlCl_3$ and $TiCl_4$. It has also been derived from various experiments that, in forming a TiAlN layer in the present embodiment, a flow rate of $NH_3$ (a volume ratio) is preferably from 2.3 to 2.9% with a total amount (a volume) of a gas supplied into the reaction furnace being defined as 100%.

The first source material gas supplied to first pipe 51 is injected into the reaction furnace through through holes 51a to 51c. The second source material gas supplied to second pipe 52 is injected into the reaction furnace through through holes 52a to 52c. FIG. 10 shows a flow of the first source material gas and a flow of the second source material gas in the pipes with a solid arrow and a dotted arrow, respectively. The TiAlN layer is thus formed on the surface of substrate 2.

The present inventors consider reasons for fabrication of the TiAlN layer according to the present embodiment with CVD as above as follows.

Referring to FIG. 10, each gas injected from each through hole in the first step diffuses through the injection hole toward substrate 2 and thus the TiAlN layer is formed on the surface of the substrate. More specifically, each gas flows through a flow path with a side of the through hole being defined as upstream and a side of the substrate being defined as downstream and chemically reacts at the surface of the substrate located in the flow path, so that the TiAlN layer as a product of the chemical reaction is formed at the surface.

In the present embodiment, as shown in FIG. 10, shield plates 53 and 54 are arranged between cutting edge 2c of substrate 2 (the surface of the substrate corresponding to the cutting edge region) and each gas injected from the through hole. Therefore, some of each gas flows as wrapping around shield plates 53 and 54 as shown with hollow arrows in the figure. The gas which flows as such (hereinafter called a "wrap-around gas") behaves in such a manner as initially reaching the surface corresponding to the rake face region in rake face 2a or the surface corresponding to the flank face region in flank face 2b and chemically reacting at such surfaces, and thereafter reaching cutting edge 2c and chemically reacting at the surface corresponding to the cutting edge region. In other words, a flow path of the wrap-around gas from each injection hole until reaching the surface corresponding to the cutting edge region is longer than each flow path of each gas from each injection hole until reaching the surface corresponding to the rake face region and the surface corresponding to the flank face region.

The wrap-around gas contains $AlCl_3$, $TiCl_4$, and $NH_3$, and reactivity between $AlCl_3$ and $NH_3$ is higher than reactivity between $TiCl_4$ and $NH_3$. Therefore, since $AlCl_3$ is consumed more than $TiCl_4$ at the surface corresponding to the rake face region and the surface corresponding to the flank face region, an atomic ratio between Al and Ti ($AlCl_3/TiCl_4$) in the wrap-around gas which reaches the surface corresponding to the cutting edge region is lower than an atomic ratio therebetween in the wrap-around gas which reaches the surface corresponding to the rake face region and the surface corresponding to the flank face region. Therefore, an amount of Al which reaches the surface corresponding to the cutting edge region is smaller than each of an amount of Al which reaches the surface corresponding to the rake face region and an amount of Al which reaches the surface corresponding to the flank face region.

For the reasons above, a content of Al in the TiAlN layer corresponding to the cutting edge region is lower than a content of Al in the TiAlN layer corresponding to each of the rake face region and the flank face region and consequently the TiAlN layer according to the present embodiment is formed.

In the manufacturing method described above, the shield plate is used so that an amount of Al which reaches the surface of the substrate corresponding to the cutting edge region can be smaller than each of an amount of Al which reaches the surface of the substrate corresponding to the rake face region and an amount of Al which reaches the surface of the substrate corresponding to the flank face region. The present invention, however, is not limited thereto. For example, in connection with positional relation with a through hole, substrate 2 may be arranged in the reaction furnace such that a distance between the injection hole and each of the surface of the substrate corresponding to the rake face region and the surface of the substrate corresponding to the flank face region is smaller than a distance between the injection hole and the surface of the substrate corresponding to the cutting edge region by bringing the surface of the substrate corresponding to the rake face region and the surface of the substrate corresponding to the flank face region closer to the through hole than the surface of the substrate corresponding to the cutting edge region.

EXAMPLES

Though the present invention will be described below in further detail with reference to Examples, the present invention is not limited thereto. A TiAlN layer containing wurtzite type AlN may also simply be denoted as a "TiAlN layer."

<Preparation of Substrate>

Two types of substrates of a substrate K and a substrate L shown in Table 1 below were prepared. Specifically, substrates made of cemented carbide in a shape of CNMG 120408N-GU (manufactured by Sumitomo Electric Industries, Ltd.) (substrate K) and SEET 13T3AGSN-G (manufactured by Sumitomo Electric Industries, Ltd.) (substrate L) were obtained by uniformly mixing source material powders composed as shown in Table 1, forming the powders into a prescribed shape by pressurization, and thereafter sintering the formed powders for 1 to 2 hours at 1300 to 1500° C.

TABLE 1

| | Composition (Mass %) | | | | |
|---|---|---|---|---|---|
| | Co | VC | $Cr_3C_2$ | TaC | WC |
| K | 6.0 | 0.2 | 0.4 | — | Remainder |
| L | 12.0 | — | — | 2.0 | Remainder |

<Formation of Coating>

A coating was formed on a surface of each substrate obtained above. Specifically, a coating was formed with chemical vapor deposition on the substrate by setting the substrate in a reaction furnace of a chemical vapor deposition apparatus.

Conditions for forming the coating are as shown in Tables 2 and 3 below. Table 2 shows conditions for forming each layer other than the TiAlN layer and Table 3 shows conditions for forming the TiAlN layer.

TABLE 2

| | | Condition for Film Formation | | |
|---|---|---|---|---|
| | Composition of Source Material Gas (Volume %) | Pressure (kPa) | Temperture (° C.) | Total Amount of Gas (L/min) |
| TiN | $TiCl_4$ = 2.0%, $N_2$ = 39.7%, $H_2$ = Remainder | 6.7 | 915 | 65.2 |
| TiCN | $TiCl_4$ = 2.0%, $CH_3CN$ = 0.7%, $H_2$ = Remainder | 9.0 | 860 | 45.3 |
| TiCNO | $TiCl_4$ = 2.1%, CO = 3.2%, $CH_4$ = 2.8%, $N_2$ = 23.7%, $H_2$ = Remainder | 16.0 | 1030 | 80.2 |
| $Al_2O_3$ | $AlCl_3$ = 1.6%, $CO_2$ = 4.5%, $H_2S$ = 0.2%, HCl = 3.5%, $H_2$ = Remainder | 6.7 | 1000 | 56.3 |

TABLE 3

| | | Composition of Source Material Gas (Volume %) | | | | | | | Volume Ratio | Condition for Arrangement | | Condition for Film Formation | | |
|---|---|---|---|---|---|---|---|---|---|---|---|---|---|---|
| | | | | | | | | | | Width of Shield Plate | Distance of Shield Plate | | | Total Amount of Gas |
| | | $TiCl_4$ | $AlCl_3$ | $NH_3$ | HCl | $N_2$ | Ar | $H_2$ | $AlCl_3/TiCl_4$ | (mm) | (mm) | Pressure (kPa) | Temperature (° C.) | (L/min) |
| Example | a | 0.25 | 0.56 | 2.80 | 0.22 | 34.7 | 5.78 | Remainder | 2.24 | 3.0 | 3.5 | 1.5 | 800 | 60.0 |
| | b | 0.30 | 0.60 | 2.80 | 0.20 | 34.7 | 5.78 | Remainder | 2.00 | 4.5 | 3.5 | 0.5 | 760 | 65.0 |
| | c | 0.26 | 0.58 | 2.88 | 0.15 | 34.7 | 5.78 | Remainder | 2.23 | 6.0 | 3.5 | 1.5 | 770 | 65.0 |
| | d | 0.20 | 0.51 | 2.80 | 0.20 | 34.7 | 5.78 | Remainder | 2.55 | 4.5 | 5.0 | 1.5 | 700 | 75.0 |
| | e | 0.21 | 0.51 | 2.89 | 0.20 | 34.7 | 5.78 | Remainder | 2.43 | 4.5 | 2.0 | 2.5 | 760 | 65.0 |
| | f | 0.18 | 0.70 | 2.60 | 0.24 | 34.7 | 5.78 | Remainder | 3.89 | 3.0 | 3.5 | 2.0 | 800 | 65.0 |
| | g | 0.18 | 0.66 | 2.60 | 0.25 | 34.7 | 5.78 | Remainder | 3.67 | 4.5 | 3.5 | 1.0 | 760 | 60.0 |
| | h | 0.15 | 0.65 | 2.75 | 0.22 | 34.7 | 5.78 | Remainder | 4.33 | 6.0 | 3.5 | 2.0 | 750 | 65.0 |
| | i | 0.20 | 0.80 | 2.72 | 0.25 | 34.7 | 5.78 | Remainder | 4.00 | 4.5 | 5.0 | 1.5 | 710 | 65.0 |
| | j | 0.22 | 0.70 | 2.69 | 0.15 | 34.7 | 5.78 | Remainder | 3.18 | 4.5 | 2.0 | 2.5 | 760 | 60.0 |
| Comparative Example | k | 0.25 | 0.56 | 2.80 | 0.22 | 34.7 | 5.78 | Remainder | 2.24 | — | — | 1.5 | 800 | 60.0 |
| | l | 0.18 | 0.70 | 2.60 | 0.24 | 34.7 | 5.78 | Remainder | 3.89 | — | — | 2.0 | 800 | 65.0 |
| | m | 0.12 | 0.61 | 3.20 | — | 6.6 | 14.20 | Remainder | 5.08 | — | — | 1.0 | 800 | 70.0 |
| | n | 0.40 | 1.30 | 1.30 | — | 6.4 | 0.00 | Remainder | 3.25 | — | — | 2.0 | 820 | 70.6 |
| | o | 0.40 | 0.70 | 4.90 | — | 24.7 | 19.80 | Remainder | 1.75 | — | — | 0.5 | 900 | 65.0 |

"Remainder" in Table 2 shows that $H_2$ occupies the remainder of the source material gas. "Total amount of gas" shows a total volumetric flow rate introduced into the chemical vapor deposition apparatus per unit time with a gas in the standard state (0° C. and 1 atmosphere) being defined as an ideal gas (which is also applicable to Table 3).

As shown in Table 3, conditions for forming the TiAlN layer include 15 patterns of a to j and k to o, among which a to j represent conditions in Examples and k to o represent conditions in Comparative Examples. In particular, under formation conditions a to j, shield plates were arranged in the reaction furnace as in FIG. 10. "Width of shield plate" in Table 3 means a vertical width of shield plates 53 and 54 in FIG. 10 and "distance of shield plate" means a smallest value of a length of a gap between shield plates 53 and 54 and cutting edge 2c of substrate 2 in a lateral direction in FIG. 10. Formation conditions m, n, and o in Table 3 are the same as the conditions for forming the TiAlN layers disclosed in PTDs 2, 3, and 4 described above, respectively.

<Fabrication of Surface Coated Cutting Tool>

Surface coated cutting tools of samples Nos. 1 to 36 shown in Table 4 below were fabricated by forming the coating on the substrate under the conditions in Tables 2 and 3.

In Table 4, for example, the surface coated cutting tool of sample No. 1 shows that a coating having a total thickness of 14.0 μm is formed on the substrate by adopting substrate K shown in Table 1 as the substrate, forming on the surface of substrate K, an underlying layer obtained by stacking a TiN layer having a thickness of 0.5 μm and a TiCN layer having a thickness of 8.5 μm in this order under the conditions in Table 2, and forming a TiAlN layer having a thickness of 5.0 μm on the underlying layer under formation condition a in Table 3. A blank field in Table 4 indicates that no applicable layer is formed.

<Characteristics of TiAlN Layer>

A TiAlN layer was fabricated on substrate K with a method under each of formation conditions a to o for evaluating characteristics of the TiAlN layer and various characteristics of the TiAlN layer were evaluated. Table 5 shows results.

TABLE 4

| | Sample No | Type of Substrate | Construction of Coating (μm) | | | Thickness of Coating (μm) |
|---|---|---|---|---|---|---|
| | | | Underlying Layer | TiAlN Layer | Outermost Layer | |
| Example | 1 | K | TiN(0.5)—TiCN(8.5) | a(5.0) | — | 14.0 |
| | 2 | K | TiN(0.5)—TiCN(8.5) | b(6.0) | — | 15.0 |
| | 3 | K | TiN(0.5)—TiCN(8.5) | c(5.0) | — | 14.0 |
| | 4 | K | TiN(0.5)—TiCN(8.5) | f(6.0) | — | 15.0 |
| | 5 | K | TiN(0.5)—TiCN(8.5) | g(5.5) | — | 14.5 |
| | 6 | K | TiN(0.5)—TiCN(8.5) | h(5.5) | — | 14.5 |
| | 7 | K | TiN(1.0) | d(12.0) | — | 13.0 |
| | 8 | K | TiN(1.0) | b(11.5) | — | 12.5 |
| | 9 | K | TiN(1.0) | e(12.5) | — | 13.5 |
| | 10 | K | TiN(1.0) | i(11.5) | — | 12.5 |
| | 11 | K | TiN(1.0) | g(12.0) | — | 13.0 |
| | 12 | K | TiN(1.0) | j(12.0) | — | 13.0 |
| | 13 | K | TiN(1.0) | h(10.5) | TiCNO(0.5)—$Al_2O_3$(1.0) | 13.0 |
| | 14 | L | TiN(0.5)—TiCN(3.5) | a(3.0) | — | 7.0 |
| | 15 | L | TiN(0.5)—TiCN(3.5) | b(4.5) | — | 8.5 |
| | 16 | L | TiN(0.5)—TiCN(3.5) | c(3.5) | — | 7.5 |
| | 17 | L | TiN(0.5)—TiCN(3.5) | f(4.5) | — | 8.5 |
| | 18 | L | TiN(0.5)—TiCN(3.5) | g(4.0) | — | 8.0 |
| | 19 | L | TiN(0.5)—TiCN(3.5) | h(2.5) | — | 6.5 |
| | 20 | L | TiN(1.0) | d(6.0) | — | 7.0 |
| | 21 | L | TiN(1.0) | b(6.5) | — | 7.5 |
| | 22 | L | TiN(1.0) | e(7.5) | — | 8.5 |
| | 23 | L | TiN(1.0) | i(6.5) | — | 7.5 |
| | 24 | L | TiN(1.0) | g(7.0) | — | 8.0 |
| | 25 | L | TiN(1.0) | j(6.0) | — | 7.0 |
| | 26 | L | TiN(1.0) | h(10.0) | TiCNO(0.5)—$Al_2O_3$(1.0) | 12.5 |
| Comparative Example | 27 | K | TiN(0.5)—TiCN(8.5) | k(5.0) | — | 14.0 |
| | 28 | K | TiN(1.0) | l(12.0) | TiCNO(0.5)—$Al_2O_3$(1.0) | 14.5 |
| | 29 | L | TiN(0.5)—TiCN(3.5) | k(4.5) | — | 8.5 |
| | 30 | L | TiN(1.0) | l(5.5) | TiCNO(0.5)—$Al_2O_3$(1.0) | 8.0 |
| | 31 | K | TiN(1.0) | m(3.5) | — | 4.5 |
| | 32 | K | TiN(0.5)—TiCN(4.0) | n(6.0) | — | 10.5 |
| | 33 | K | TiN(1.0) | o(3.5) | — | 4.5 |
| | 34 | L | TiN(1.0) | m(3.5) | — | 4.5 |
| | 35 | L | TiN(0.5)—TiCN(4.0) | n(6.0) | — | 10.5 |
| | 36 | L | TiN(1.0) | o(3.5) | — | 4.5 |

TABLE 5

| | | Detection of Wurtzite Type | Al Ratio | | | Tc (111) | Hardness Hv (GPa) | | | Young's Modulus E (GPa) | | | Hv/E | | |
|---|---|---|---|---|---|---|---|---|---|---|---|---|---|---|---|
| | | | XE | XR | XF | | edge | rake | flank | edge | rake | flank | edge | rake | flank |
| Example | a | No | 0.43 | 0.67 | 0.66 | 3.6 | 30.5 | 32.5 | 33.1 | 512.6 | 720.0 | 726.0 | 0.060 | 0.045 | 0.046 |
| | b | No | 0.40 | 0.73 | 0.66 | 4.0 | 30.1 | 34.5 | 34.2 | 530.2 | 721.6 | 714.3 | 0.057 | 0.048 | 0.048 |
| | c | No | 0.40 | 0.78 | 0.74 | 3.5 | 28.5 | 34.5 | 34.4 | 506.9 | 763.5 | 756.0 | 0.056 | 0.045 | 0.046 |
| | d | No | 0.42 | 0.72 | 0.67 | 3.7 | 29.6 | 31.2 | 31.5 | 498.3 | 700.0 | 701.6 | 0.059 | 0.045 | 0.045 |
| | e | No | 0.40 | 0.78 | 0.78 | 2.9 | 28.0 | 33.5 | 33.3 | 469.3 | 781.6 | 788.3 | 0.060 | 0.043 | 0.042 |
| | f | No | 0.55 | 0.80 | 0.75 | 3.2 | 31.2 | 35.1 | 35.8 | 510.3 | 716.9 | 720.6 | 0.061 | 0.049 | 0.050 |
| | g | No | 0.53 | 0.85 | 0.78 | 3.0 | 30.9 | 35.5 | 35.2 | 510.4 | 736.6 | 736.3 | 0.061 | 0.048 | 0.048 |
| | h | No | 0.52 | 0.90 | 0.87 | 2.9 | 28.9 | 37.5 | 37.4 | 473.2 | 794.0 | 796.3 | 0.061 | 0.047 | 0.047 |
| | i | No | 0.55 | 0.84 | 0.80 | 3.5 | 32.0 | 34.6 | 34.7 | 530.6 | 735.0 | 725.6 | 0.060 | 0.047 | 0.048 |
| | j | No | 0.52 | 0.89 | 0.90 | 4.0 | 30.2 | 37.8 | 38.2 | 494.4 | 796.1 | 799.3 | 0.061 | 0.047 | 0.048 |
| Comparative Example | k | No | 0.67 | 0.65 | 0.65 | 3.9 | 34.0 | 33.5 | 33.4 | 630.0 | 632.6 | 640.0 | 0.054 | 0.053 | 0.052 |
| | l | No | 0.80 | 0.76 | 0.82 | 3.3 | 36.6 | 36.2 | 36.5 | 780.0 | 782.0 | 778.6 | 0.047 | 0.046 | 0.047 |
| | m | No | 0.91 | 0.88 | 0.90 | 2.0 | 33.6 | 33.7 | 34.8 | 589.3 | 591.3 | 587.5 | 0.057 | 0.057 | 0.059 |
| | n | Yes | 0.89 | 0.86 | 0.93 | 1.1 | 32.0 | 31.5 | 32.0 | 736.9 | 735.6 | 748.6 | 0.043 | 0.043 | 0.043 |
| | o | Yes | 0.88 | 0.83 | 0.89 | 0.2 | 32.0 | 33.2 | 33.2 | 773.6 | 736.9 | 744.3 | 0.043 | 0.045 | 0.045 |

A field of "detection of wurtzite type" in Table 5 shows a result of observation of a crystal structure of the TiAlN layer with the method of measuring X-ray diffraction spectra described above. "No" means that no peak derived from the wurtzite type crystal structure was observed but only a peak derived from the NaCl type crystal structure was observed and "Yes" means observation of a peak derived from the wurtzite type crystal structure.

A field of "Al ratio" in Table 5 shows a ratio of Al in the TiAlN layer corresponding to each of the cutting edge region, the rake face region, and the flank face region. An average value from three or more measurement points was adopted as a ratio of Al in each region.

In a cutting test which will be described later, a cutting edge portion of the surface coated cutting tool was used as a cutting edge. Therefore, a cross-section of the TiAlN layer in the cutting edge region in the cutting edge portion was adopted as a measurement sample of the cutting edge region. For the same reason, a cross-section of the TiAlN layer in the rake face region distant by 50 to 100 μm from a boundary between the cutting edge region in the cutting edge portion and the rake face region was adopted as a measurement sample of the rake face region and a cross-section of the TiAlN layer in the flank face region distant by 50 to 200 μm from a boundary between the cutting edge region in the cutting edge portion and the flank face region was adopted as a measurement sample of the flank face region.

A field of "TC (111)" shows a result of an orientation index TC (111). Each value was calculated with the method described above and an average value from three measurement points was adopted. Each hardness and each Young's modulus shown in Table 5 were found by pressing an indenter at a load of 3000 mgf perpendicularly in a direction of thickness of the TiAlN layer with a nano-indentation tester (manufactured by Elionix Inc.). "edge", "rake", and "flank" in the table mean the "cutting edge region," the "rake face region," and the "flank face region," respectively.

As shown in Table 5, the TiAlN layers fabricated under formation conditions a to j were confirmed to have the NaCl type crystal structure and satisfy (1) to (5) above. The TiAlN layers fabricated under formation conditions k to o did not satisfy these conditions.

Hv/E of the TiAlN layers fabricated under formation conditions a to j was highest in the cutting edge and a value thereof for each of the rake face and the flank face was smaller than the value for the cutting edge by 0.005 or more.

<Cutting Test 1>

A time period for cutting until a flank face wear amount (Vb) reached 0.20 mm under cutting conditions below, of the surface coated cutting tools in Examples and Comparative Examples shown in Table 6 below, was counted and a final form of damage of the cutting edge thereof was observed. Table 6 shows results. A longer time period for cutting indicates a higher hardness and longer lifetime. The final form of damage shown as "wear" means that the cutting edge was worn without a fracture and the final form of damage shown as "chipping" means that the cutting edge was chipped.

<Cutting Conditions>

Work material: Cutting of outer circumference of FCD 600 round bar
Peripheral speed: 200 m/min.
Feed rate: 0.15 mm/rev.
Depth of cut: 1.0 mm
Cutting solution: Used

TABLE 6

| | Sample No | Time Period for Cutting (Minute) | Final Form of Damage |
|---|---|---|---|
| Example | 1 | 32 | Wear |
| | 2 | 34 | Wear |
| | 3 | 33 | Wear |
| | 4 | 32 | Wear |
| | 5 | 31 | Wear |
| | 6 | 33 | Wear |
| | 7 | 36 | Wear |
| | 8 | 35 | Wear |
| | 9 | 35 | Wear |
| | 10 | 37 | Wear |
| | 11 | 37 | Wear |
| | 12 | 38 | Wear |
| | 13 | 36 | Wear |
| Comparative Example | 27 | 15 | Wear |
| | 28 | 15 | Chipping |
| | 31 | 8 | Wear |
| | 32 | 11 | Chipping |
| | 33 | 9 | Chipping |

As is clear from Table 6, it was confirmed that the surface coated cutting tools in Examples were higher in both of wear resistance and chipping resistance and hence better in characteristics of both of a hardness and fracture resistance than the surface coated cutting tools in Comparative Examples.

<Cutting Test 2>

A time period for cutting until a cutting edge was fractured under cutting conditions below, of the surface coated cutting tools in Examples and Comparative Examples shown in Table 7 below, was counted. Table 7 shows results. A longer time period for cutting indicates higher fracture resistance.

<Cutting Conditions>
Work material: SCM 435 grooved
Peripheral speed: 200 m/min.
Feed rate: 0.20 mm/rev.
Depth of cut: 1.0 mm
Cutting solution: Used

TABLE 7

|  | Sample No | Time Period for Cutting (Minute) |
|---|---|---|
| Example | 1 | 5 |
|  | 2 | 6 |
|  | 3 | 6 |
|  | 4 | 7 |
|  | 5 | 7 |
|  | 6 | 9 |
|  | 7 | 5 |
|  | 8 | 6 |
|  | 9 | 7 |
|  | 10 | 7 |
|  | 11 | 8 |
|  | 12 | 8 |
|  | 13 | 8 |
| Comparative Example | 27 | 2 |
|  | 28 | 1 |
|  | 31 | 3 |
|  | 32 | 1 |
|  | 33 | 2 |

As is clear from Table 7, the surface coated cutting tools in Examples were higher in chipping resistance and hence higher in fracture resistance than the surface coated cutting tools in Comparative Examples.

<Cutting Test 3>

A cutting distance until a flank face wear amount (Vb) reached 0.20 mm under cutting conditions below, of the surface coated cutting tools in Examples and Comparative Examples shown in Table 8 below, was measured and a final form of damage of the cutting edge thereof was observed. Table 8 shows results. A longer cutting distance indicates a higher hardness and longer lifetime. A final form of damage shown as "fracture" means that the cutting edge was fractured. "Fracture" means a large fracture in the cutting edge as compared to chipping which means a minute fracture.

<Cutting Condition>
Work material: FCD 700 block material
Peripheral speed: 350 m/min.
Feed rate: 0.30 mm/rev.
Depth of cut: 2.0 mm
Cutting solution: Used
Cutter: WGC 4160 (manufactured by Sumitomo Electric Hardmetal Corporation)

TABLE 8

|  | Sample No | Cutting Distance (m) | Final Form of Damage |
|---|---|---|---|
| Example | 14 | 24 | Wear |
|  | 15 | 24 | Wear |
|  | 16 | 25 | Wear |
|  | 17 | 23 | Chipping |

TABLE 8-continued

|  | Sample No | Cutting Distance (m) | Final Form of Damage |
|---|---|---|---|
|  | 18 | 27 | Wear |
|  | 19 | 27 | Wear |
|  | 20 | 22 | Wear |
|  | 21 | 25 | Wear |
|  | 22 | 25 | Wear |
|  | 23 | 26 | Chipping |
|  | 24 | 26 | Wear |
|  | 25 | 28 | Wear |
|  | 26 | 28 | Wear |
| Comparative Example | 29 | 5 | Fracture |
|  | 30 | 4 | Fracture |
|  | 34 | 5 | Fracture |
|  | 35 | 4 | Fracture |
|  | 36 | 2 | Fracture |

As is clear from Table 8, the surface coated cutting tools in Examples were higher in both of wear resistance and chipping resistance and hence better in characteristics of both of a hardness and fracture resistance than the surface coated cutting tools in Comparative Examples.

<Cutting Test 4>

A cutting distance until a flank face wear amount (Vb) reached 0.20 mm under cutting conditions below, of the surface coated cutting tools in Examples and Comparative Examples shown in Table 9 below, was measured and a final form of damage of the cutting edge thereof was observed. Table 9 shows results. A longer cutting distance indicates higher fracture resistance and longer lifetime.

<Cutting Condition>
Work material: S450C block material
Peripheral speed: 160 m/min.
Feed rate: 0.30 mm/rev.
Depth of cut: 2.0 mm
Cutting solution: Not used
Cutter: WGC 4160 (manufactured by Sumitomo Electric Hardmetal Corporation)

TABLE 9

|  | Sample No | Cutting Distance (m) | Final Form of Damage |
|---|---|---|---|
| Example | 14 | 12 | Fracture |
|  | 15 | 15 | Fracture |
|  | 16 | 15 | Fracture |
|  | 17 | 11 | Fracture |
|  | 18 | 12 | Fracture |
|  | 19 | 15 | Fracture |
|  | 20 | 13 | Fracture |
|  | 21 | 16 | Fracture |
|  | 22 | 16 | Fracture |
|  | 23 | 12 | Fracture |
|  | 24 | 15 | Fracture |
|  | 25 | 15 | Fracture |
|  | 26 | 18 | Fracture |
| Comparative Example | 29 | 3 | Fracture |
|  | 30 | 4 | Fracture |
|  | 34 | 6 | Fracture |
|  | 35 | 3 | Fracture |
|  | 36 | 4 | Fracture |

As is clear from Table 9, the surface coated cutting tools in Examples were higher in fracture resistance than the surface coated cutting tools in Comparative Examples.

It should be understood that the embodiments and the examples disclosed herein are illustrative and non-restrictive in every respect. The scope of the present invention is defined by the terms of the claims, rather than the embodiments and the examples above, and is intended to include any modifications within the scope and meaning equivalent to the terms of the claims.

REFERENCE SIGNS LIST 1 surface coated cutting tool; 2 substrate; 2a rake face; 2b flank face; 2c cutting edge; 3 coating; 11 rake face; 12 flank face; 13 cutting edge; E ridgeline; F, R virtual plane; EE virtual ridgeline; EF, ER virtual boundary line; 51 first pipe; 52 second pipe; 51a to 51c, 52a to 52c through hole; and 53, 54 shield plate

The invention claimed is:

1. A surface coated cutting tool having surfaces including a rake face and a flank face and a cutting edge defined by a boundary portion between the rake face and the flank face, the surface coated cutting tool comprising:
    a substrate; and
    a coating which covers the surfaces of the substrate,
    the coating having a TiAlN layer having an NaCl type crystal structure, and
    relation of $0.65<XR\leq0.9$, $0.65<XF\leq0.9$, $0.4\leq XE\leq0.7$, $XR-XE\geq0.2$, and $XF-XE\geq0.2$ being satisfied, with a composition of the TiAlN layer in a cutting edge region located in the cutting edge being expressed as $Ti_{1-XE}Al_{XE}N$, a composition of the TiAlN layer in a rake face region located in the rake face being expressed as $Ti_{1-XR}Al_{XR}N$, and a composition of the TiAlN layer in a flank face region located in the flank face being expressed as $Ti_{1-XF}Al_{XF}N$.

2. The surface coated cutting tool according to claim 1, wherein
    the TiAlN layer has an orientation index TC (111) of a (111) plane satisfying relation of $1.0<TC\,(111)\leq4.0$.

3. The surface coated cutting tool according to claim 1, wherein
    the TiAlN layer has a thickness not smaller than 1 μm and not greater than 10 μm.

4. The surface coated cutting tool according to claim 1, wherein
    the coating has a thickness not smaller than 3 μm and not greater than 15 μm.

5. A method for manufacturing the surface coated cutting tool according to claim 1, the method comprising:
    forming the TiAlN layer with CVD on the substrate arranged in a reaction furnace,
    the forming the TiAlN layer including a first step of supplying a first source material gas containing Ti and Al and a second source material gas containing ammonia into the reaction furnace where the substrate is arranged,
    in the first step, an amount of Al which reaches the surface of the substrate corresponding to the cutting edge region being smaller than each of an amount of Al which reaches the surface of the substrate corresponding to the rake face region and an amount of Al which reaches the surface of the substrate corresponding to the flank face region.

6. The method for manufacturing the surface coated cutting tool according to claim 5, wherein
    the first source material gas and the second source material gas are injected into the reaction furnace through through holes of a first pipe and thorough holes of a second pipe, respectively, and
    shield plates are arranged between the surface of the substrate corresponding to the cutting edge region and the through holes.

* * * * *